(12) United States Patent
Lo et al.

(10) Patent No.: US 12,266,560 B2
(45) Date of Patent: *Apr. 1, 2025

(54) FILM THICKNESS UNIFORMITY IMPROVEMENT USING EDGE RING AND BIAS ELECTRODE GEOMETRY

(71) Applicant: Applied Materials, Inc., Santa Clara, CA (US)

(72) Inventors: Kin Pong Lo, Fremont, CA (US); Vladimir Nagorny, Tracy, CA (US); Wei Liu, San Jose, CA (US); Theresa Kramer Guarini, San Jose, CA (US); Bernard L. Hwang, Santa Clara, CA (US); Malcolm J. Bevan, Santa Clara, CA (US); Jacob Abraham, San Jose, CA (US); Swayambhu Prasad Behera, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/832,775

(22) Filed: Jun. 6, 2022

(65) Prior Publication Data

US 2022/0301920 A1 Sep. 22, 2022

Related U.S. Application Data

(63) Continuation of application No. 16/939,898, filed on Jul. 27, 2020, now Pat. No. 11,380,575.

(51) Int. Cl.
*H01L 21/687* (2006.01)
*C23C 16/455* (2006.01)
(Continued)

(52) U.S. Cl.
CPC .. *H01L 21/68735* (2013.01); *C23C 16/45536* (2013.01); *C23C 16/4585* (2013.01);
(Continued)

(58) Field of Classification Search
CPC ......... H01L 21/68735; H01L 21/67017; C23C 16/45536; C23C 16/4585; H01J 37/321; H01J 37/32623; H01J 37/32651
See application file for complete search history.

(56) References Cited

U.S. PATENT DOCUMENTS 5,474,612 A * 12/1995 Sato .................... H01L 21/6875
118/728
5,810,931 A 9/1998 Stevens et al.
(Continued)

FOREIGN PATENT DOCUMENTS

EP 1134791 A2 9/2001
JP H09232294 A 9/1997
(Continued)

OTHER PUBLICATIONS

International Search Report and Written Opinion dated Apr. 26, 2021 for Application No. PCT/US2020/063774.
(Continued)

*Primary Examiner* — Jeffrie R Lund
(74) *Attorney, Agent, or Firm* — Patterson + Sheridan, LLP

(57) ABSTRACT

Embodiments of the present disclosure generally relate to the fabrication of integrated circuits and to apparatus for use within a substrate processing chamber to improve film thickness uniformity. More specifically, the embodiments of the disclosure relate to an edge ring. The edge ring may include an overhang ring.

20 Claims, 9 Drawing Sheets

(51) Int. Cl.
  *C23C 16/458* (2006.01)
  *H01J 37/32* (2006.01)
  *H01L 21/67* (2006.01)

(52) U.S. Cl.
  CPC ...... *H01J 37/321* (2013.01); *H01J 37/32623* (2013.01); *H01J 37/32651* (2013.01); *H01L 21/67017* (2013.01)

(56) References Cited

U.S. PATENT DOCUMENTS

| | | | |
|---|---|---|---|
| 5,891,348 | A | 4/1999 | Ye et al. |
| 6,159,299 | A | 12/2000 | Koai et al. |
| 6,277,198 | B1 | 8/2001 | Yao et al. |
| 6,521,292 | B1 | 2/2003 | Yudovsky et al. |
| 7,176,403 | B2 | 2/2007 | Steger |
| 8,226,769 | B2 * | 7/2012 | Matyushkin ...... H01L 21/67109 156/345.52 |
| 8,342,119 | B2 | 1/2013 | Yudovsky et al. |
| 8,460,470 | B2 * | 6/2013 | Hirata ................. C30B 29/06 118/725 |
| 11,380,575 | B2 * | 7/2022 | Lo .................... H01J 37/32651 |
| 12,046,457 | B2 * | 7/2024 | Sasaki ............... H01L 21/68735 |
| 2004/0069227 | A1 | 4/2004 | Ku et al. |
| 2007/0034337 | A1 | 2/2007 | Nishimoto et al. |
| 2009/0221150 | A1 | 9/2009 | Hammond, IV et al. |
| 2012/0285619 | A1 | 11/2012 | Matyushkin et al. |
| 2014/0235063 | A1 | 8/2014 | McMillin et al. |
| 2015/0129129 | A1 | 5/2015 | Shimizu et al. |
| 2016/0351378 | A1 | 12/2016 | Kishi et al. |
| 2017/0002461 | A1 | 1/2017 | Johanson et al. |
| 2019/0013232 | A1 | 1/2019 | Yan et al. |
| 2019/0228952 | A1 | 7/2019 | Dorf et al. |
| 2020/0118798 | A1 | 4/2020 | Luere et al. |
| 2021/0375591 | A1 | 12/2021 | Chandrashekar et al. |
| 2022/0028656 | A1 | 1/2022 | Lo et al. |
| 2022/0301920 | A1 * | 9/2022 | Lo ........................ H01J 37/321 |
| 2023/0162955 | A1 * | 5/2023 | Parkhe .............. H01L 21/67248 118/723 R |

FOREIGN PATENT DOCUMENTS

| | | | | |
|---|---|---|---|---|
| JP | H10280173 | A | 10/1998 | |
| JP | 2003503841 | A * | 1/2003 | |
| JP | 2004165645 | A | 6/2004 | |
| JP | 2011-014943 | A | 1/2011 | |
| KR | 10-2124766 | | 6/2020 | |
| TW | 201523773 | A * | 6/2015 | ............ H01J 37/321 |
| TW | 201933532 | A | 8/2019 | |
| WO | 2019143473 | A1 | 7/2019 | |
| WO | 2019/204754 | A1 | 10/2019 | |

OTHER PUBLICATIONS

Korean Office Action dated Oct. 28, 2021 for Application No. 30-2020-63868.
Office Action for Japanese Application No. 2023-505370 dated May 7, 2024.
Extended European Search Report for European Application No. 20946791.9 dated Jul. 30, 2024.
Office Action for Taiwan Application No. 110105464 dated Oct. 1, 2024.
Search Report for Taiwan Application No. 110105464 dated Sep. 27, 2024.
Office Action for Korean Application No. 10-2023-7003472 dated Nov. 20, 2024.

* cited by examiner

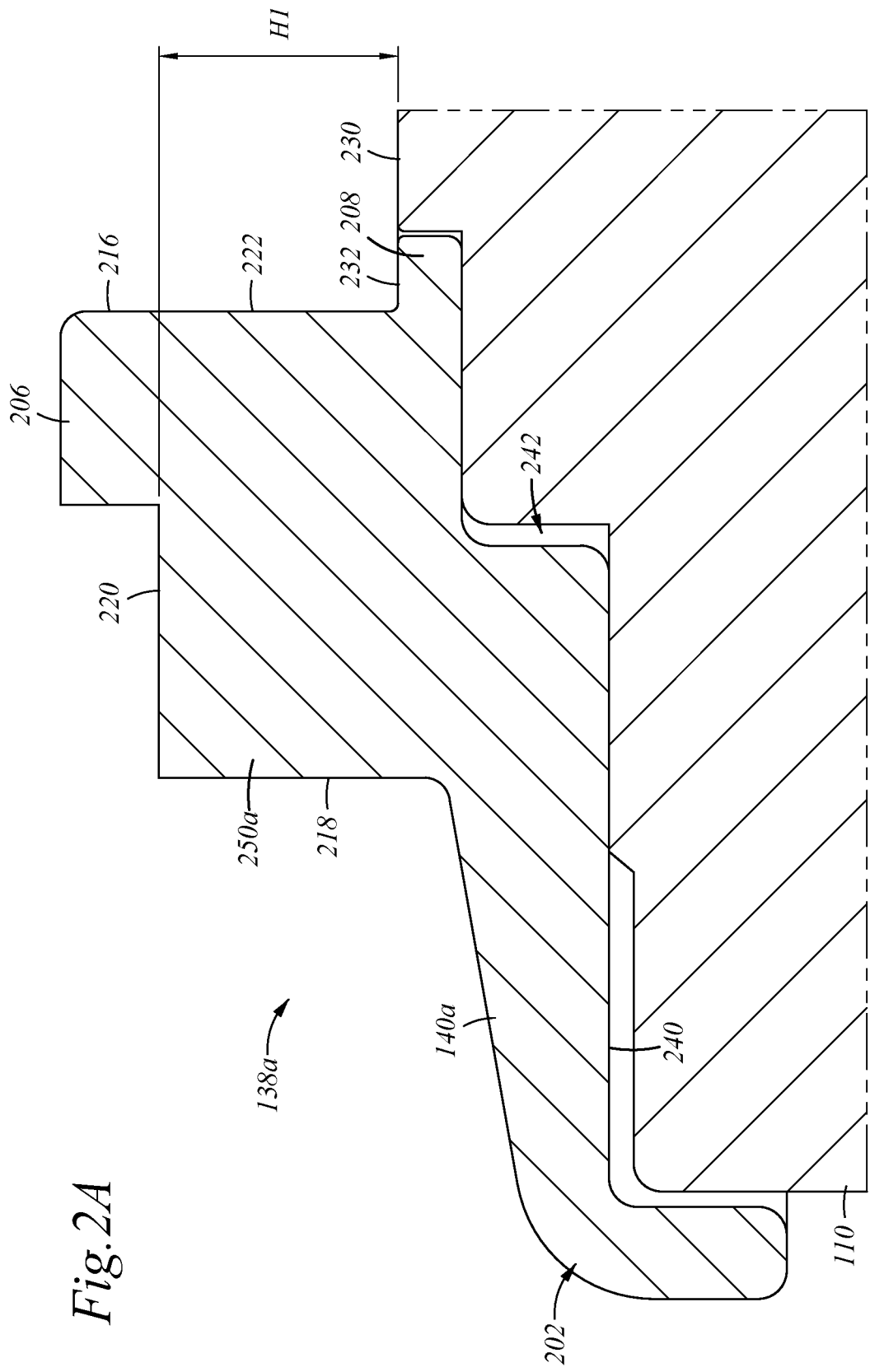

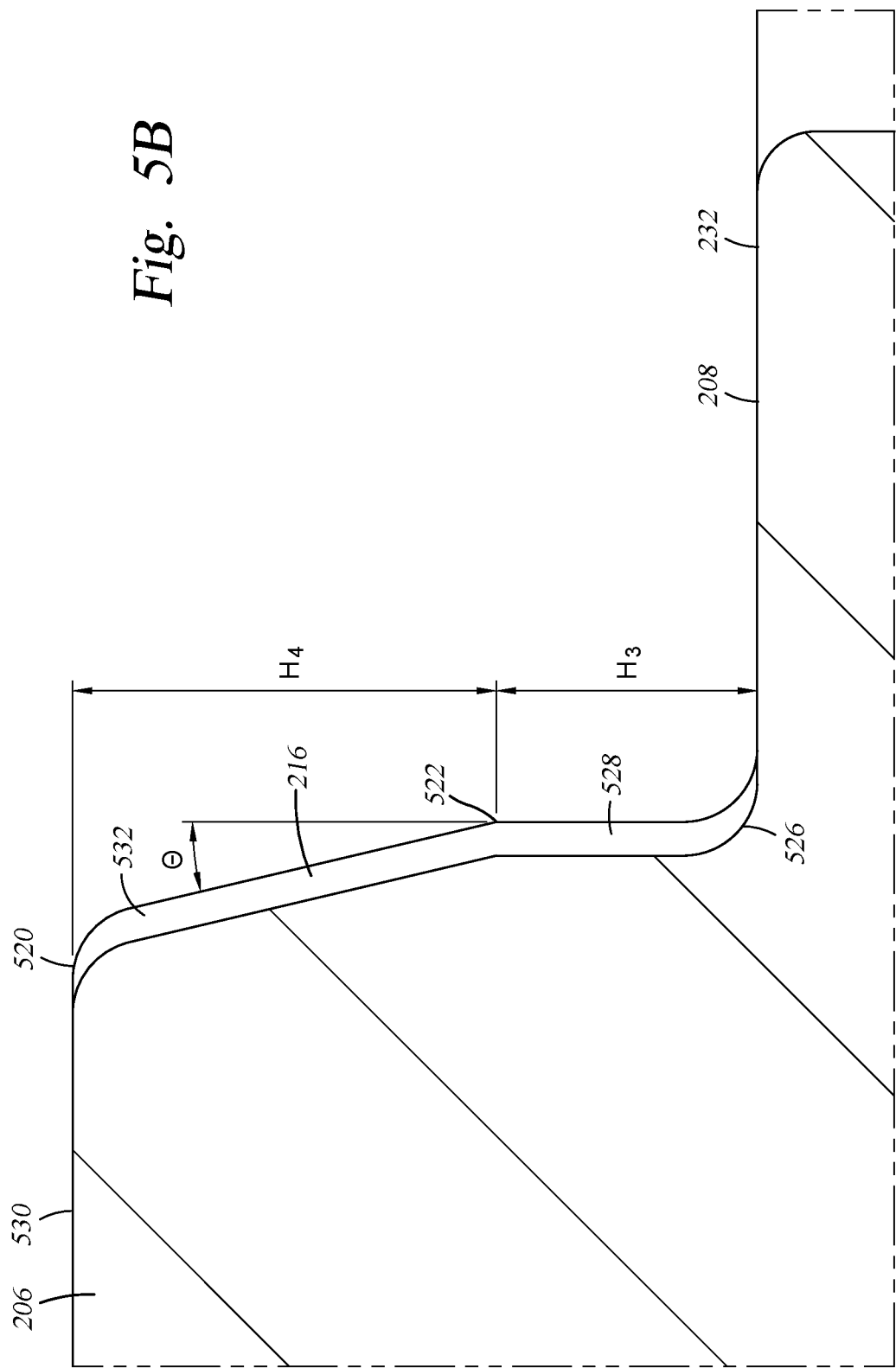

FILM THICKNESS UNIFORMITY IMPROVEMENT USING EDGE RING AND BIAS ELECTRODE GEOMETRY

CROSS-REFERENCE TO RELATED APPLICATIONS

This is a continuation application of U.S. patent application Ser. No. 16/939,898, filed Jul. 27, 2020, which is herein incorporated by reference in its entirety.

BACKGROUND

Field

Embodiments of the present disclosure generally relate to the fabrication of integrated circuits and to apparatus for use within a substrate processing chamber to improve film thickness uniformity.

Description of the Related Art

A primary goal of substrate processing is to obtain the largest useful surface area, and as a result the greatest number of chips, possible from each substrate. Some factors to consider include processing variables that effect the uniformity and thickness of the layer deposited on the substrate, and contaminants that can attach to the substrate and render all or a portion of the substrate useless. Controlling these factors maximizes the useful surface area for each substrate processed.

Recent developments in semiconductor processing have caused interest in new treatment applications that require low ion current and high ion energy. This enables deep treatment without growing a film. To satisfy the low ion current and high ion energy requirement, bias power exceeding source power by 10-20 times or more has been used. With such a high bias-to source power ratio, the plasma density and the plasma current to the substrate is affected. The affected plasma current and density result in film thickening toward the substrate edge.

Edge rings have traditionally been used to improve film thickness uniformity by altering the deposition rate near an edge of a substrate. However, typical edge rings still result in poor uniformity and deposition rates near the extreme edges of the substrate. Accordingly, there is a need in the art for edge rings that produce higher uniformity.

SUMMARY

Embodiments of the present disclosure generally relate to an apparatus for improving the film thickness near an edge of a substrate when during low ion current and high ion energy applications.

In one embodiment, an apparatus for substrate processing includes an edge ring and an overhang ring. The edge ring includes a bottom surface, an upper surface, and a groove disposed in the upper surface. The overhang ring is disposed in the groove and includes a first portion extending from the groove and a second portion connected to the first portion and extending radially inward.

In another embodiment, an apparatus for substrate processing includes an edge ring and an overhang ring. The edge ring includes a bottom surface, an upper surface, a central opening, and a groove disposed in the upper surface. The overhang ring is disposed in the groove and includes a first portion extending upwards from the groove and a second portion extending radially inward toward a central axis of the overhang ring.

In yet another embodiment, an apparatus for substrate processing includes an edge ring and an overhang ring. The edge ring further includes a support surface, an upper surface, groove disposed in the upper surface, and a plurality of tabs disposed on the upper surface. The overhang ring is disposed in the groove and further includes a first portion extending from the groove and a second portion connected to the first portion and extending radially inward.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 2A-2B are cross sectional views of edge rings for use within the process chamber of FIG. 1.

FIG. 5A-5B are partial cross sectional views of the edge ring of FIGS. 3A-3B.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
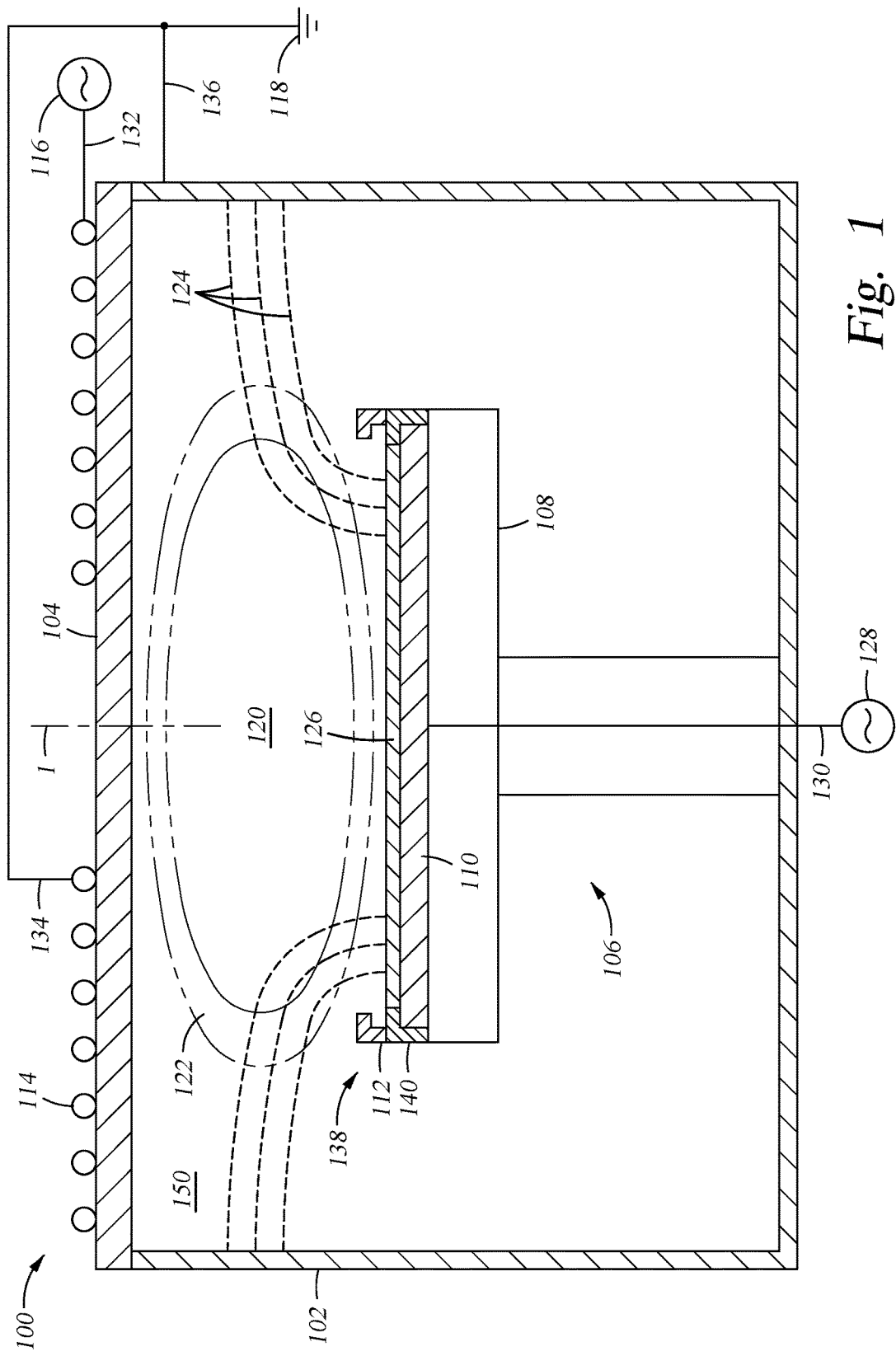
FIG. 1 is a schematic cross sectional view of a process chamber.

FIG. 1 is a schematic cross sectional view of a process chamber 100. The process chamber 100 is an Inductively Coupled Plasma (ICP) chamber. The process chamber 100 includes an inductive coil 114, a lid 104, a first Radio Frequency (RF) power source 116, a chamber body 102, a pedestal assembly 106, a substrate 126, an edge ring assembly 138, and a second RF power source 128. The first process chamber is capable of generating a plasma therein. The plasma includes a first plasma region 120 surrounded by a second plasma region 122 of lower plasma density. The first plasma region 120 and/or the second plasma region 122 electrically couple to the ground via a plurality of RF current lines 124.

The inductive coil 114 is disposed on the lid 104 of the process chamber 100. The inductive coil 114 is centered around the central axis 1 of the process chamber 100. The inductive coil 114 transmits the source power for the process chamber 100. The source power is an RF power, received from the RF power source 116. The inductive coil receives an RF power of about 50 W to about 500 W for transmission to the interior of the process chamber 100. In some embodiments, the inductive coil can receive an RF power of about 50 W to about 250 W, such as about 50 W to about 200 W, such as about 50 W to about 150 W, such as about 75 W to about 150 W, such as about 100 W. The first RF power source and the inductive coil 114 are connected by a first connection 132 at one end of the inductive coil 114. The first connection 132 may be one or more wires or cables.

The inductive coil 114 may additionally be attached to a second connection 134. The second connection 134 is similar to the first connection 132. The second connection is connected to ground 118. Connecting the second connection to ground 118 connects the inductive coil 114 to ground.

The electrostatic chuck 110 is powered by the second RF power source 128. The second RF power source 128 produces the bias power for the process chamber 100. The second RF power source 128 can produce an RF power of about 500 W to about 3000 W to be applied to the electrostatic chuck 110. In some embodiments, the second RF power source 128 can produce an RF power of about 600 W to about 2500 W, such as about 700 W to about 2250 W, such as about 750 W to about 2200 W, such as about 800 W to about 2000 W to be applied to the electrostatic chuck 110. The second RF power source 128 and the electrostatic chuck are connected by a third connection 130. The third connection 130 may be one or more wires or cables.

The lid 104 is a dielectric lid. The lid 104 is disposed on and covers the top of the process chamber 100. The lid 104 separates the inductive coil 114 from the processing region 150. The lid may be removable or may be hinged (not shown). The processing region 150 is within the chamber body 102 and is defined as the region within the chamber body 102 and the lid 104. The processing region 150 includes the pedestal assembly 106 for supporting a substrate 126 and an edge ring assembly 138. The first plasma region 120 and the second plasma region 122 are contained within the processing region 150 when generated.

The pedestal assembly 106 includes a support body 108, an electrostatic chuck 110, a second RF power source 128, and the edge ring assembly 138. The electrostatic chuck 110 is disposed on top of the support body 108. The electrostatic chuck 110 is sized to be disposed on top of the support body 108 and receives the substrate 126 on the top surface of the electrostatic chuck 110. The edge ring assembly 138 is disposed over the support body 108 and part of the electrostatic chuck 110. The edge ring assembly 138 is disposed around the substrate 126.

The edge ring assembly 138 surrounds the substrate 126. The edge ring assembly 138 includes an overhang ring 112 and an edge ring 140. The overhang ring 112 and the edge ring 140 are described in greater detail herein.

The first plasma region 120 is a region of high density plasma within the processing region 150. The second plasma region 122 is a region of low density plasma within the processing region 150. The second plasma region 122 surround the first plasma region 120 and has a lower plasma density than the first plasma region 120. The first and second plasma regions 120, 122 may be oxygen based plasmas. The oxygen based plasmas may be used when performing treatments that include silicon oxides, such as silicon dioxide.

The plurality of RF current lines 124 represent the communication between the substrate 126 surface and the sidewalls of the chamber body 102. The RF current lines 124 in embodiments using previous edge rings, do not pass through either of the first or the second plasma regions 120, 122 during low pressure ICP substrate processing. However, edge rings, such as the edge ring assembly 138 and other edge ring assemblies described herein alter that RF current lines 124 near the edge of the substrate, such that the RF current lines pass through the first and the second plasma region 120, 122. The RF current lines 124 are redirected by the edge ring assembly 138 as current will pass through the path of least resistance. Not to be bound by theory, it is believed the edge ring assembly 138 obstructs a path of lesser resistance from the substrate to the sidewalls of the chamber body 102. The RF current lines 124 are then forced up through the first and the second plasma regions 120, 122. This effect may be more pronounced when utilizing relatively high bias powers. The RF current lines 124 passing through the first or the second plasma region 120, 122 reduce film thickening near a substrate 126 edge.

Figure 2B:
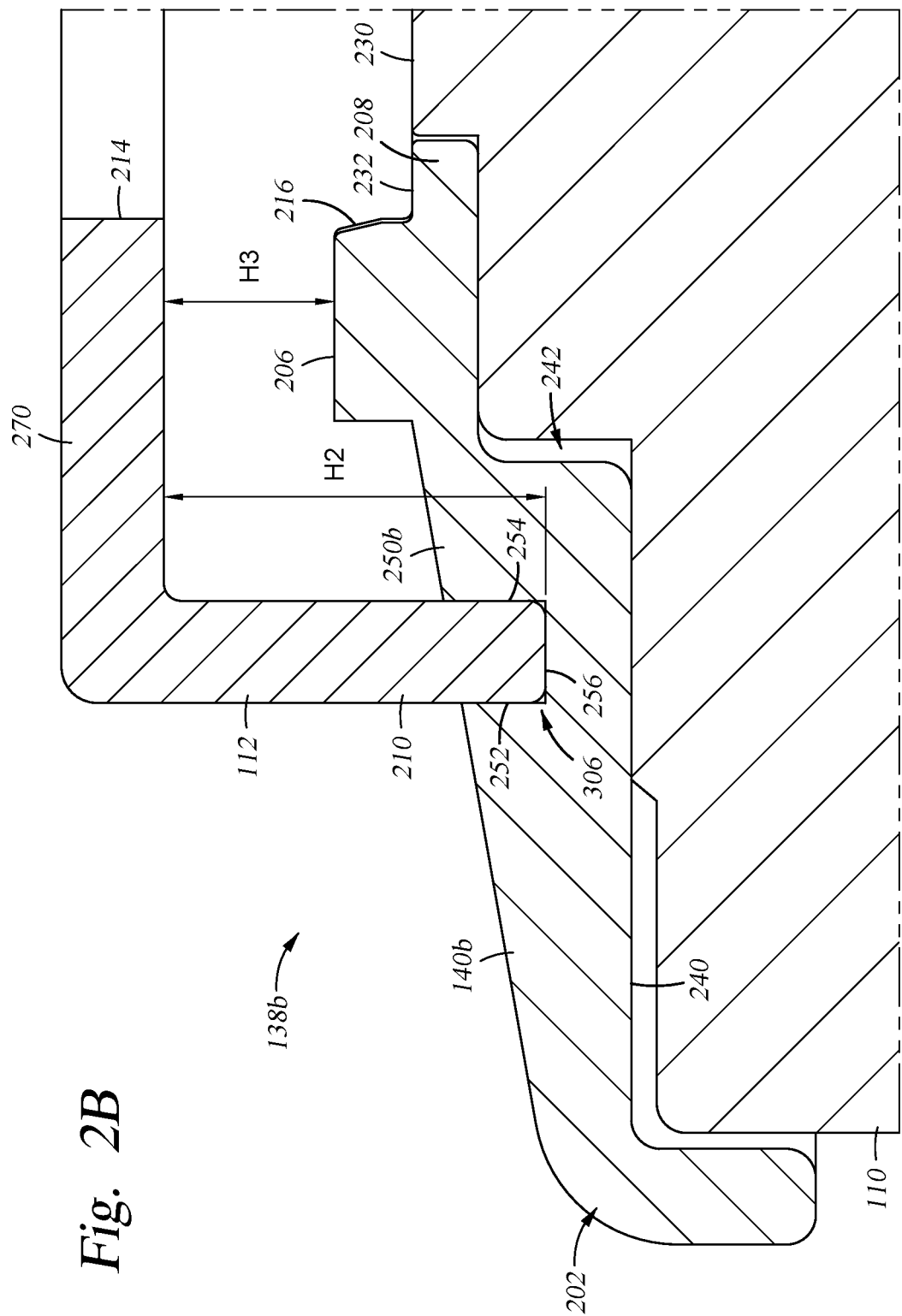

FIGS. 2A-2B are cross sectional views of edge ring assemblies 138a, and 138b used within the process chamber 100 of FIG. 1. The edge ring assemblies 138a, 138b are disposed on over and around the outer edge of the electrostatic chuck 110, as shown in FIG. 1. The edge ring assemblies 138a, 138b include two different embodiments of edge rings 140a, 140b. The first embodiment of the edge ring assembly 138a, illustrated in FIG. 2A, includes a first edge ring 140a having a main body 250a. The first edge ring 140a includes a main body 250a, a cantilever 208 disposed radially inward of the main body 250a, an outer body 202 disposed radially outwards of the main body 250a, and a plurality of vertical protrusions 206 disposed on top of the main body 250a.

The first edge ring 140a of FIG. 2A is one continuous (e.g., monolithic) body. The first edge ring 140a includes a main body 250a that is vertically extended. The extended main body 250a extends from an outer body 202. The outer body 202 is cylindrical and is the part of the first edge ring 140a which is disposed adjacent to the electrostatic chuck 110. The outer body 202 has a bottom surface 240. The bottom surface 240 is adjacent to the top surface of the electrostatic chuck 110. The bottom surface 240 includes a step 242 radially inward of the outer body 202. The step 242 corresponds to and engages with a similar stepped portion of the electrostatic chuck 110.

The outer body 202 further includes a radially inward cantilever 208. The cantilever 208 is the innermost portion of the edge ring 140a. The cantilever 208 is disposed adjacent to a substrate support surface 230 of the electrostatic chuck 110. The cantilever 208 has a top cantilever surface 232 that is parallel to the substrate support surface 230. The top cantilever surface 232 may be substantially coplanar with the substrate support surface 230. In some embodiments, the top cantilever surface 232 is utilized to protect the underside of an edge of the substrate, such as the substrate 126. The edge of the substrate 126 may extend over at least a portion of the cantilever 208 during processing.

The main body 250a has a height H1. The height H1 of the extended main body 250a may be about 10 mm to about 40 mm, such as about 15 mm to about 35 mm, such as about 20 mm to about 30 mm. In some embodiments, the height H1 of the extended main body 250a is about 25 mm. The extended main body 250a has an inner surface 222 and an outer surface 218. In some embodiments, the height H1 is the height of the inner surface 222 of the extended main body 250a. The inner surface 222 extends from the top cantilever surface 232 to the bottom of the vertical protrusion 206.

The inner surface 222 is the surface of the extended main body 250a closest to the central axis of the edge ring assembly 138a. The outer surface 218 is the surface of the extended main body 250a furthest from the central axis of the edge ring assembly 138a. The extended main body 250a additionally includes an upper surface 220. The upper surface 220 connects the inner surface 222 and the outer surface 218. There is a vertical protrusion 206 disposed on top of the upper surface 220. The vertical protrusion 206 has a protrusion inner surface 216. The protrusion inner surface 216 is coplanar with the inner surface 222 of the extended main body 250a. There may be a plurality of vertical protrusions 206 disposed on the extended main body 250a. The plurality of vertical protrusions 206 are disposed evenly about the upper surface 220 of the edge ring 140a.

FIG. 2B illustrates an edge ring assembly 138b according to a second embodiment. The second edge ring assembly 138b includes a second edge ring 140b and an overhang ring 112, such as the overhang ring 112 shown in FIG. 1 disposed within a groove 306. The edge ring assembly 138b may also be used in the processing chamber 100 of FIG. 1. The second edge ring 140b of FIG. 2B is one continuous edge ring.

The second edge ring 140b includes a groove 306 formed in an upper surface of the main body 250b. The groove 306 is sized to receive an overhang ring 112. The outer body 202 has a bottom surface 240. The bottom surface 240 is adjacent to the top surface of the electrostatic chuck 110. The bottom surface 240 includes a stepped region 242. The stepped region 242 corresponds to and engages with a similar stepped portion of the electrostatic chuck 110. The outer body 202 further includes a cantilever 208. The cantilever 208 is the most radially inward portion of the edge ring 140b. The cantilever 208 is disposed adjacent to a substrate support surface 230 of the electrostatic chuck 110. The cantilever 208 has a top cantilever surface 232 that is parallel to the substrate support surface 230. The top cantilever surface 232 may be substantially coplanar with the substrate support surface 230. In some embodiments, the top cantilever surface 232 is utilized to protect the underside of an edge of the substrate, such as the substrate 126. The edge of the substrate 126 may extend over at least a portion of the cantilever 208.

There is a vertical protrusion 206 disposed on a top the outer body of the second edge ring 140b. The vertical protrusion 206 has a protrusion inner surface 216. The protrusion inner surface 216 intersects the top cantilever surface 232 of the cantilever 208. There may be a plurality of vertical protrusions 206 disposed on the top cantilever surface 232. The plurality of vertical protrusions 206 are disposed evenly about the second edge ring 140b.

The groove 306 of the edge ring 140b is disposed radially outward of the cantilever 208 with respect to the central axis of the edge ring 140b. The groove 306 is disposed radially outward of the vertical protrusion 206. The groove 306 is sized to receive an overhang ring 112. The groove 306 has an inner sidewall 254, an outer sidewall 252, and a bottom surface 256. The outer and inner sidewalls 252, 254 are vertical sidewalls, and are a parallel to one another, while being perpendicular to the bottom surface 256. The outer and inner sidewalls 252, 254 are spaced less than about 25 mm from each other, such as less than about 20 mm from each other, such as less than about 15 mm from each other. In some embodiments, the outer and inner sidewalls 252, 254 are spaced the same distance apart from each other as the width of a first portion 210 of the overhang ring 112. The outer and inner sidewalls 252, 254 are parallel with one another and form concentric rings about the central axis of the edge ring 138b. The outer and inner sidewalls 252, 254 are connected by the bottom surface 256.

The overhang ring 112 includes a first portion 210 and a second portion 270. The first portion 210 extends from the groove 306 in an upwards direction. In some examples, the first portion 210 is a vertical portion and extends vertically from the groove 306 of the second edge ring 140b. The height H2 of the first portion 210 is about 20 mm to about 40 mm, such as about 20 mm to about 35 mm, such as about 25 mm to about 30 mm. The second portion 270 extends radially inward toward the central axis of the edge ring 138b. The second portion 270 is disposed at an angle to the first portion 210. In the embodiment described in FIG. 2B, the second portion 270 is a horizontal portion and is normal to the first portion 210 of the overhang ring 112. The second portion 270 is disposed at the distal end of the first portion 210.

The second portion is disposed on top of the first portion 210 and has a thickness of about 2 mm to about 8 mm, such as about 3 mm to about 7 mm, such as about 4 mm to about 6 mm, such as about 4.5 mm to about 5.5 mm.

The second portion may be disposed at a height H2 from the bottom of the groove 306. The second portion may additionally be defined as being a height H3 from the top of the vertical protrusions 206. The height H3 is about 10 mm to about 30 mm, such as about 15 mm to about 25 mm, such as about 17.5 mm to about 22.5 mm. In some embodiments, the height H3 is about 18 mm to about 20 mm.

It is imagined that embodiments wherein either the first portion 210 is not a vertical portion or the second portion 270 is not a horizontal portion are possible. In embodiments wherein the first portion 210 is not a vertical portion or the second portion 270 is not a horizontal portion, the angle between the first and second portions 210, 270 may vary.

The first portion 210 and the second portion 270 of the overhang ring 112 are continuous with one another. In some embodiments, the entirety of the first portion 210 and the second portion 270 are formed from a continuous piece of quartz.

The inner overhang surface 214 is the radially inward edge of the second (e.g., horizontal) portion 270. The inner overhang surface 214 is disposed above the protrusion inner surface 216, such that the second portion 270 of the overhang ring 112 extends at least partially over the vertical protrusions 206. In some embodiments, the inner overhang surface 214 may have a similar radial position, such as within +/−10 millimeters as the protrusion inner surface 216. In some embodiments, the inner overhang surface 214 extends over only part of the vertical protrusions 206 and the inner overhang surface 214 is disposed radially outward of the protrusion inner surface 216. The inner overhang surface 214 has an inner radius less than the inner radius of the edge ring 140b, such that the inner overhang surface 214 does not extend over a substrate, such as the substrate 126, to allow placement of the substrate within the central opening of the edge ring 138b.

In embodiments described herein, the entirety of both the edge rings 140a, 140b and the overhang ring 112 are a quartz material, such as silicon oxide (e.g., $SiO_2$). Each of the edge rings 140a, 140b and the overhang ring 112 may be made completely of quartz. In some embodiments, only parts of the edge rings 140a, 140b and the overhang ring 112 are a quartz material and other materials may also be utilized.

The first and second embodiments of the edge ring assemblies 138a, 138b may share some components not explicitly stated herein. For example, the first and second embodiments of the edge ring assemblies 138a, 138b include similar outer bodies 202, vertical protrusions 206, cantilevers 208, bottom surfaces 240, and stepped regions 242.

Figure 3A:
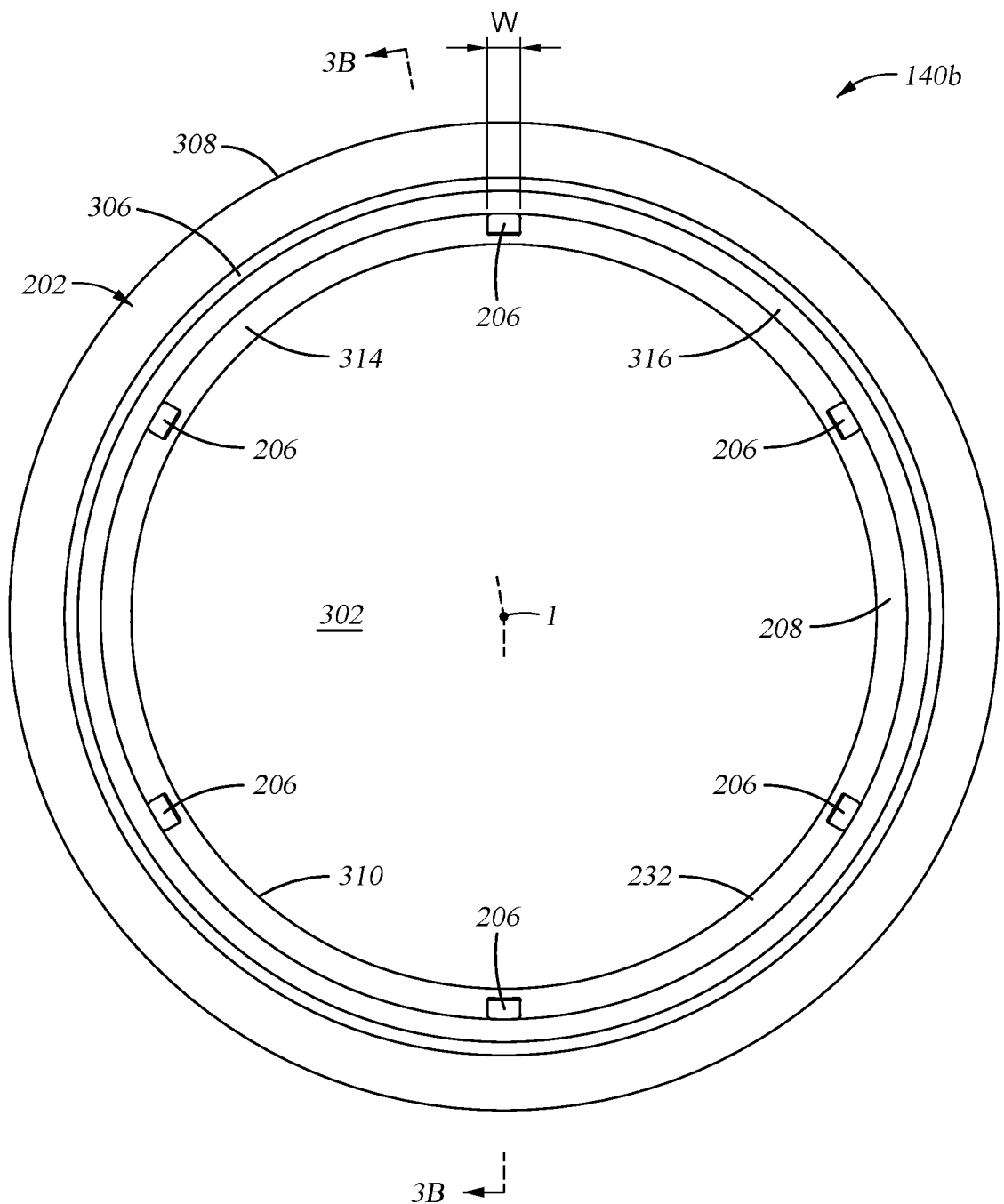
FIG. 3A is a schematic plan view of the edge ring of FIG. 2B.
Figure 3B:
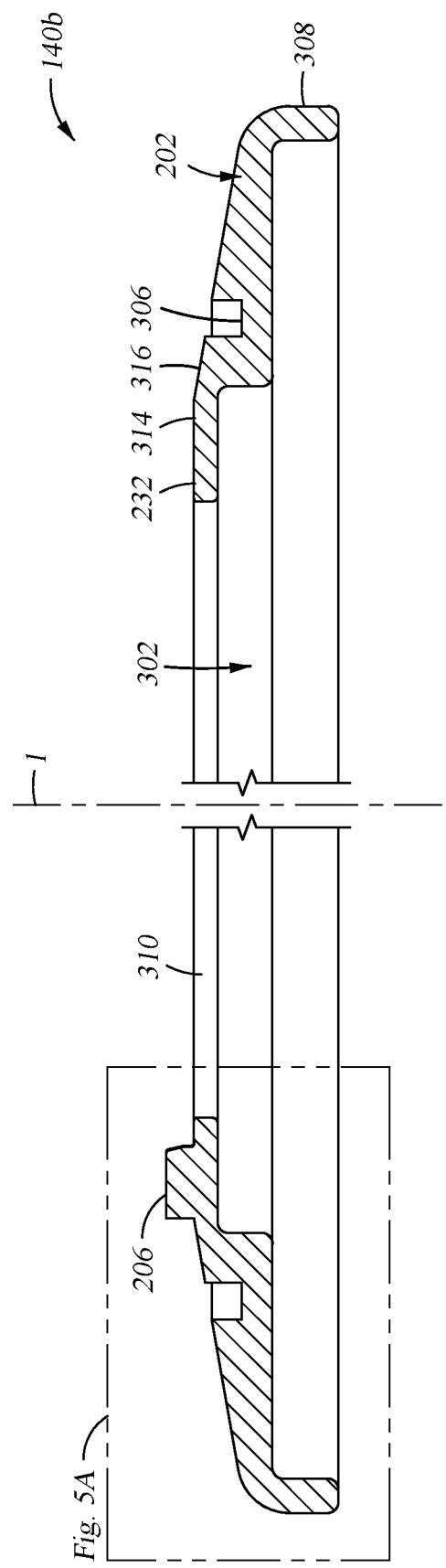
FIG. 3B is a schematic cross sectional view of the edge ring of FIG. 2B.

FIG. 3A is a schematic plan view of the edge ring 140b of FIG. 2B. FIG. 3B is a schematic sectional view of the edge ring 140b of FIG. 2B. The edge ring 140b includes a central opening 302, the outer body 202, the plurality of vertical protrusions 206, the groove 306, the top cantilever surface 232, an intermediate surface 316, and an outer ledge surface 308.

The opening 302 is circular and formed through the center of the edge ring 140b. In some embodiments, the diameter of the opening 302 is about 295 mm to about 300 mm, such as about 296 mm to about 298 mm, such as about 297 mm to about 298 mm. The diameter of the opening 302 is slightly less than the diameter of a substrate being processed, such that the cantilever 208 is disposed slightly beneath the substrate and protects the backside of the substrate.

The top cantilever surface 232 is disposed radially outward from the opening 302, such that the top cantilever surface 232 is the surface between the inner cantilever surface 310 of the edge ring 140b and the intermediate surface 316. The outer edge of the top cantilever surface 232 has a diameter of about 315 mm to about 335 mm, such as about 320 mm to about 330 mm such as about 322 mm to about 328 mm. The top cantilever surface 232 is a horizontal surface and is planar.

The plurality of vertical protrusions 206 are formed on top of the top cantilever surface 232. In some embodiments, the plurality of vertical protrusions 206 are disposed on the outer portion of the top cantilever surface 232. The inner protrusion inner surface has an inner diameter of about 300 mm to about 315 mm, such as about 300 mm to about 310 mm, such as about 302 mm to about 310 mm, such as about 302 mm to about 308 mm. The plurality of vertical protrusions 206 have a protrusion outer surface 502. The protrusion outer surface has a diameter of about 315 mm to about 335 mm, such as about 320 mm to about 330 mm. The plurality of vertical protrusions 206 includes six protrusions. In some embodiments, the number of vertical protrusions 206 may be 3 protrusions to 12 protrusions, such as 3 protrusions to 10 protrusions, such as 4 protrusions to 9 protrusions, such as 4 protrusions to 8 protrusions. The vertical protrusions are spaced evenly about the central axis 1 and are equidistant from one another about the top cantilever surface 232. The plurality of vertical protrusions 206 may have a width W of about 5 mm to about 25 mm, such as about 5 mm to about 20 mm, such as about 10 mm to about 15 mm. The width W is the distance across the face of the vertical protrusion 206 facing the central axis 1. The vertical protrusions 206 facilitate securing and alignment of a substrate during processing.

The intermediate surface 316 is the surface between the top cantilever surface 232 and the groove 306. The intermediate surface 316 is an angled surface, such that the intermediate surface 316 slopes downward as the radial distance from the central axis 1 increases.

The groove 306 is disposed between the intermediate surface 316 and the outer body 202. The groove 306 has two sidewalls 252, 254. The inner sidewall 254 is adjacent and connected to the intermediate surface 316. The outer sidewall 252 is adjacent and connected to the outer body 202. The inner sidewall 254 of the groove 306 has a diameter of about 325 mm to about 350 mm, such as about 330 mm to about 350 mm, such as about 335 mm to about 345 mm. The outer sidewall 252 of the groove 306 has a diameter of about 340 mm to about 360 mm, such as about 345 mm to about 355 mm. The groove 306 is formed around the entirety of the edge ring 140b.

In some embodiments, the groove 306 may be a discontinuous groove. In this embodiment, the overhang ring 112 would have a first portion 210 to fit into the discontinuous groove. Alternatively, the overhang ring 112 and the edge ring 140b could be adapted to attach the overhang ring 112 and the edge ring 140b using a fastener, sonic welding, or an adhesive. The edge ring 140b and the overhang ring 112 could also be to be one continuous component or part. This embodiment could utilize three dimensional printing or molding to form the overhang ring 112 and the edge ring 140b.

The outer body 202 has an outer ledge surface 308. The outer ledge surface 308 is the outermost surface of the edge ring 140b. The outer ledge surface 308 may be a vertical surface and may be part of the outer body 202. The outer ledge surface 308 of the edge ring 140b has a diameter of about 375 mm to about 425 mm, such as about 380 mm to about 415 mm, such as about 385 mm to about 405 mm, such as about 390 mm to about 400 mm.

FIG. 3B is a cross sectional side view of the edge ring 140b. The edge ring 140b includes the opening 302, the outer body 202, the plurality of vertical protrusions 206, the groove 306, the inner cantilever surface 310, and the outer ledge surface 308. The cross sectional view of FIG. 3B is taken along the dotted line shown in FIG. 3A.

The edge ring 140b includes a central axis, which, when the edge ring 140b is positioned in the process chamber 100 of FIG. 1, is coaxial with the central axis 1. The central axis 1 passes through the opening 302.

Figure 4:
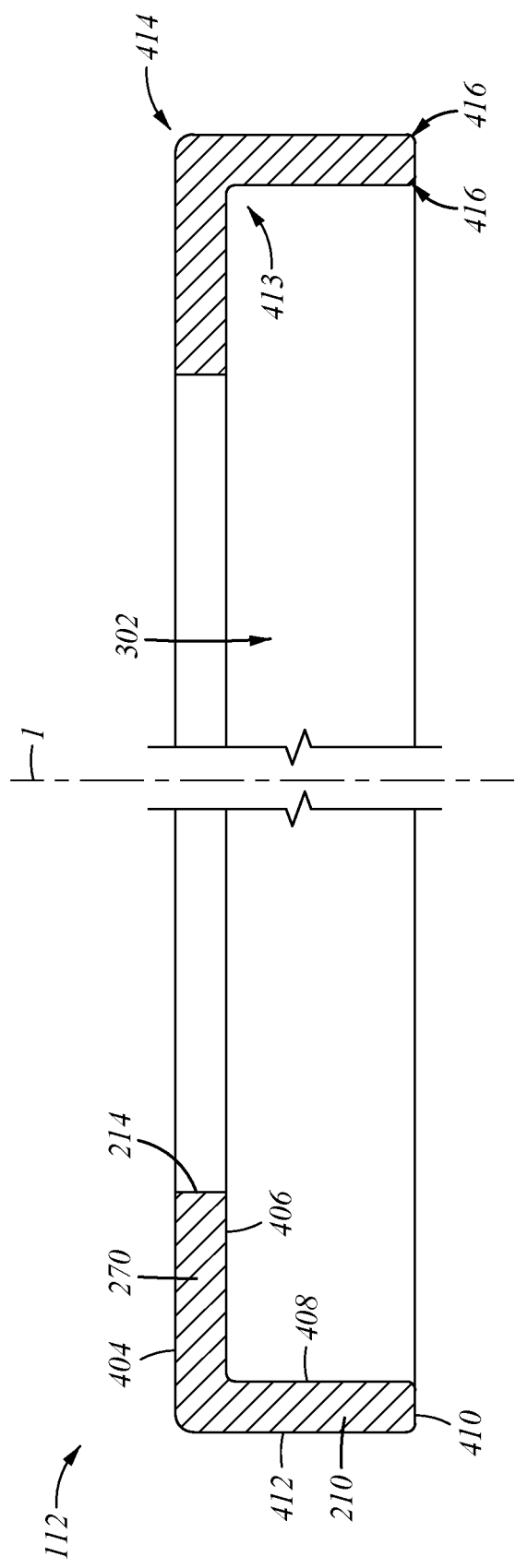
FIG. 4 is a cross sectional view of an overhang ring utilized with the edge ring of FIGS. 3A-3B.

FIG. 4 is a cross sectional side view of an overhang ring 112 utilized with the edge ring 140b of FIGS. 3A-3B. The overhang ring 112 includes a first portion 210 and a second portion 270. The overhang ring is inserted into the groove 306 of the edge ring 140b. The overhang ring 112 is also centered along the central axis 1. In some embodiments, the central axis is the central axis 1 of the edge ring 140b or the central axis 1 of the overhang ring 112. There is an opening 302 formed in the overhang ring 112, such that the central axis 1 passes through the opening 302.

The first portion 210 includes an inner surface 408 and an outer surface 412. The inner surface 408 and the outer surface 412 are connected on one end by a bottom surface 410. Both of the inner surface 408 and the outer surface 412 are vertical surfaces, such that the inner surface 408 and the outer surface 412 of the first portion 210 extend upwards. The inner surface 408 and the outer surface 412 are parallel to each other. The inner surface 408 and the outer surface 412 extend in a similar and upward direction from the bottom surface 410.

The inner surface 408 has a diameter of about 325 mm to about 350 mm, such as about 330 mm to about 350 mm, such as about 335 mm to about 345 mm. The outer surface 412 has a diameter of about 335 mm to about 365 mm, such as about 340 mm to about 360 mm, such as about 345 mm to about 355 mm.

The second portion 270 includes a lower surface 406, a top surface 404, an inner overhang surface 214, and the outer surface 412. The lower surface 406 of the second portion 270 intersects and is connected to the inner surface 408 of the first portion 210. The outer surface 412 extends from the first portion 210 to the second portion 270 and forms the outer surface 412 of the second portion 270. The top surface 404 intersects and connects to the outer surface 412. The top surface is the upper surface of the overhang ring 112. The inner overhang surface 214 is the innermost surface of the overhang ring 112. The inner overhang surface 214 intersects and connects the lower surface 406 and the top surface 404 of the second portion 270 of the overhang ring 112.

The inner overhang surface 214 is parallel to the inner surface 408 and the outer surface 412 of the first portion 210.

The inner overhang surface 214 has a diameter of about 300 mm to about 315 mm, such as about 300 mm to about 310 mm, such as about 302 mm to about 310 mm, such as about 302 mm to about 308 mm, such as about 303 mm to about 306 mm. The inner overhang surface 214 may be sized to allow a substrate having a diameter of 300 mm to pass through the opening 302 between the inner overhang surface 214.

The top surface 404 of the second portion 270 of the overhang ring 112 and the lower surface 406 of the second portion 270 of the overhang ring 112 are parallel. The perpendicular between the top surface 404 and the second portion 270 is about 2.5 mm to about 7.5 mm, such as about 3 mm to about 7 mm, such as about 3.5 mm to about 6.5 mm, such as about 4 mm to about 6 mm. The perpendicular represents the thickness of the second portion 270. The inner overhang surface 214 has a length of about 2.5 mm to about 7.5 mm, such as about 3 mm to about 7 mm, such as about 3.5 mm to about 6.5 mm, such as about 4 mm to about 6 mm.

The top surface 404 and the lower surface 406 of the second portion 270 of the overhang ring 112 may be perpendicular to the inner overhang surface 214 and the outer surface 412. The top surface 404 and the lower surface 406 of the second portion 270 of the overhang ring 112 extend radially inwards from the first portion 210 of the overhang ring 112. The lower surface 406 of the second portion 270 of the overhang ring 112 is smaller than the top surface 404 of the second portion 270 of the overhang ring 112, such that the surface area of the lower surface 406 is less than the surface area of the top surface 404.

The lower surface 406 of the second portion 270 of the overhang ring 112 and the inner surface 408 of the first portion 210 of the overhang ring 112 intersect at a first corner 413. The first corner 413 is an inner corner of the overhang ring 112 and is at an angle of about 80 degrees to about 100 degrees, such as about 85 degrees to about 95 degrees, such as about 90 degrees. The first corner 413 is a rounded or beveled corner. The curve of the first corner 413 may have a radius of curvature of about 1.5 mm to about 4 mm, such as about 2 mm to about 3.5 mm, such as about 2 mm to about 3 mm.

The top surface 404 of the second portion 270 of the overhang ring 112 and the outer surface 412 of the overhang ring intersect at a second corner 414. The second corner 414 is an outer corner of the overhang ring 112 and has an outer angle of about 260 degree to about 280 degrees, such as about 265 degrees to about 275 degrees, such as about 270 degrees. The second corner 414 is a rounded or beveled corner. The curve of the second corner 414 have a radius of curvature of about 0.5 mm to about 2 mm, such as about 1 mm to about 1.5 mm.

The intersection of the bottom surface 410 with the outer surface 412 and the inner surface 408 creates bottom corners 416. The bottom corners 416 have a radius of curvature of about 0.5 mm to about 2 mm, such as about 1 mm to about 1.5 mm. The bottom corners have outer angles of about 260 degree to about 280 degrees, such as about 265 degrees to about 275 degrees, such as about 270 degrees.

Figure 5A:
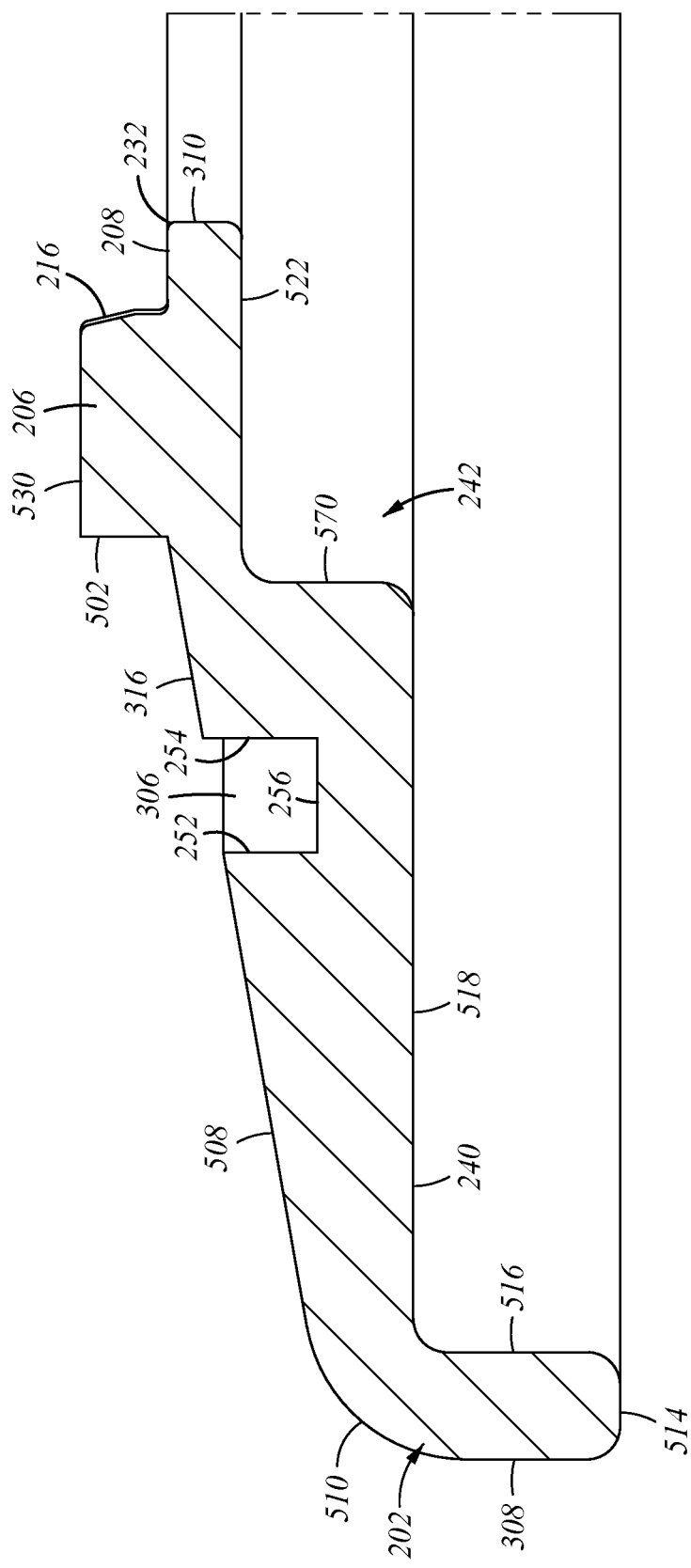

FIG. 5A-5B are partial cross sectional views of the edge ring 140b of FIGS. 3A-3B. FIG. 5A illustrates a close up view of one side of the cross sectional side view of FIG. 3B. FIG. 5B illustrates a close up view of the protrusion inner surface 216 as shown in FIG. 5A.

The portion of the edge ring 140b shown in FIG. 5A includes the inner cantilever surface 310, the cantilever 208, the vertical protrusions 206, the intermediate surface 316, the groove 306, the outer body 202, the outer ledge surface 308, the bottom surface 240, and the stepped region 242. The edge ring 140b is a single part and is disposed around an electrostatic chuck 110 and a substrate 126.

The cantilever 208 is disposed adjacent to the inner cantilever surface 310 of the edge ring 140b. The inner cantilever surface 310 is the innermost portion of the edge ring 140b. The top cantilever surface 232 is the upper surface of the cantilever 208. The inner cantilever surface 310 is the inner surface of the cantilever 208.

The top protrusion surface 530 of the cantilever 208 intersects the protrusion inner surface 216 of the vertical protrusions 206. The protrusion inner surface 216 extends from the top cantilever surface 232 to the top protrusion surface 530. The protrusion inner surface 216 is an angled surface and is at an angle greater than 90 degrees with respect to the top cantilever surface 232. The top protrusion surface 530 is a horizontal surface. The top protrusion surface 530 extends from the protrusion inner surface 216 to the protrusion outer surface 502. The protrusion outer surface 502 is a vertical surface. The protrusion outer surface extends from the top protrusion surface 530 to the intermediate surface 316. The protrusion outer surface 502 meets the top protrusion surface 530 on one end and the intermediate surface 316 on the other end.

The intermediate surface 316 extends from the protrusion outer surface 502 to the groove 306. More specifically, the intermediate surface 316 extends from the bottom end of the protrusion outer surface 502 to the top end of the inner sidewall 254 of the groove 306. The intermediate surface 316 is an angled surface, such that the intermediate surface 316 slopes downward as the radial distance from the central axis 1 increases. The intermediate surface 316 may be at an angle of about 5 degrees to about 15 degrees with respect to the top cantilever surface 232, such as about an angle of about 7.5 degrees to about 12.5 degrees, such as about 9 degrees to about 11 degrees.

The groove 306 is disposed between the intermediate surface 316 and the outer body 202. The groove 306 has two sidewalls 252, 254. The inner sidewall 254 is adjacent and connected to the intermediate surface 316. The outer sidewall 252 is adjacent and connected to the outer body 202. The inner sidewall 254 and the outer sidewall 252 are vertical sidewalls. The inner sidewall 254 and the outer sidewall 252 are connected by the bottom surface 256 of the groove 306. The bottom surface 256 of the groove 306 is a horizontal surface. The bottom surface 256 of the groove 306 is about 1 mm to about 5 mm below an inner bottom surface 522, such as 1.5 mm to about 4 mm below an inner bottom surface 522, such as about 2 mm to about 3 mm below the inner bottom surface 522 or about 2.25 mm to 2.75 mm below the inner bottom surface 522.

The inner sidewall 254 is larger than the outer sidewall 252 within the groove 306. The outer sidewall 252 is smaller than the inner sidewall 254 because of the slope of the intermediate surface 316 and the outer body 202. The bottom surface 256 of the groove is sized to receive the bottom surface 410 of the overhang ring 112.

The outer body 202 includes the inner main surface 508, the outer curved portion 510, and the outer ledge surface 308. The inner main surface 508 is coplanar with the intermediate surface 316, such that the outer body 202 has a surface at an angle of about 5 degrees to about 15 degrees with respect to the top cantilever surface 232, such as about an angle of about 7.5 degrees to about 12.5 degrees, such as about 9 degrees to about 11 degrees.

The outer ledge surface 308 of the outer body 202 is the outermost surface of the edge ring 140b. The outer ledge surface 308 of the outer body 202 is connected to the inner main surface 508 by the outer curved portion 510. The outer curved portion 510 connects the outer edge of the inner main surface 508 and the top edge of the outer ledge surface 308. The outer curved portion has a radius of curvature of about 3 mm to about 10 mm, such as about 4 mm to about 9 mm, such as about 5 mm to about 8 mm, such as about 6 mm to about 7 mm. The outer ledge surface 308 of the outer body 202 extends downward to protect an outer edge of the electrostatic chuck 110 (shown in FIGS. 2A-2B).

The outer ledge surface 308 of the outer body 202 is connected to a ledge bottom surface 514. The ledge bottom surface 514 is a horizontal surface. The ledge bottom surface 514 connects the outer ledge surface 308 to the inner ledge surface 516. The ledge bottom surface 514 is connected to the outer ledge surface 308 and the inner ledge surface 516 at curved corners. The curved corners between the outer ledge surface 308 and the ledge bottom surface 514 as well as the inner ledge surface 516 and the ledge bottom surface 514 have a radius of curvature of about 0.5 mm to about 2.5 mm, such as about 0.75 mm to about 2 mm, such as about 1 mm to about 1.5 mm.

The inner ledge surface 516 is a vertical surface and is parallel to the outer ledge surface 308. The inner ledge surface 516 is sized to surround an outer surface of an electrostatic chuck. The inner ledge surface 516 is part of the bottom surface 240 of the edge ring 140b. The inner ledge surface 516 is connected on a first end to the ledge bottom surface 514 and on a second end to the primary bottom surface 518.

The primary bottom surface 518 is a horizontal surface. The primary bottom surface 518 is a planar surface and extends from the inner ledge surface 516 to the lower stepped surface 570. The lower stepped surface 570 is a vertical surface that is part of the stepped region 242. The lower stepped surface 570 is radially inward of the inner ledge surface 516 and the primary bottom surface 518. The lower stepped surface 570 is also radially inward of the groove 306. The lower stepped surface 570 connects the primary bottom surface 518 and the inner bottom surface 522.

The inner bottom surface 522 is a horizontal surface that connects the lower stepped surface 570 to the inner cantilever surface 310. The inner bottom surface 522 is below the vertical protrusions 206 and the cantilever 208. The inner bottom surface 522 is a planar surface. The inner bottom surface 522 is part of the stepped region 242.

FIG. 5B illustrates a close-up view of the protrusion inner surface 216. The protrusion inner surface 216 includes a first inner protrusion surface 528 and a second inner protrusion surface 532. The protrusion inner surface 216 is a curved inner surface. The radius of curvature of the protrusion inner surface 216 is about 150 mm to about 165 mm, such as about 150 mm to about 160 mm, such as about 152 mm to about 158 mm, such as about 154 mm to about 156 mm. The first inner protrusion surface 528 is a vertical surface extending from the top cantilever surface 232 of the cantilever 208. The first inner protrusion surface 528 is connected to the top cantilever surface 232 at a first protrusion corner 526. The first protrusion corner 526 may be a curved corner, such that the first protrusion corner 526 has a radius of curvature of about 1 mm to about 5 mm, such as about 2 mm to about 4 mm. The first inner protrusion surface 528 has a height H3 of about 1 mm to about 5 mm, such as about 2 mm to about 4 mm, such as about 2.5 mm to about 3.5 mm.

The second inner protrusion surface 532 is disposed adjacent to the first inner protrusion surface 528 and connects to the first inner protrusion surface 528 at a second protrusion corner 524. The second inner protrusion surface 532 is a positively sloped surface as the distance from the central axis increases. The second inner protrusion surface 532 is offset by an angle θ from a vertical line, such that the second inner protrusion surface 532 has an angle θ of about 5 degrees to about 20 degrees, such as about 7 degrees to about 15 degrees, such as about 9 degrees to about 12 degrees.

The second inner protrusion surface 532 has a height H4. The height H4 of the second inner protrusion surface 532 is about 1 mm to about 4 mm, such as about 1.5 mm to about 3 mm, such as about 2 mm to about 2.5 mm. The second inner protrusion surface 532 is connected to the top protrusion surface 530 at a third protrusion corner 520. The third protrusion corner 520 is a curved corner, such that the third protrusion corner 520 has a radius of curvature of about 0.1 mm to about 0.5 mm, such as about 0.2 mm to about 0.4 mm, such as 0.25 mm to about 0.35 mm.

Figure 6:
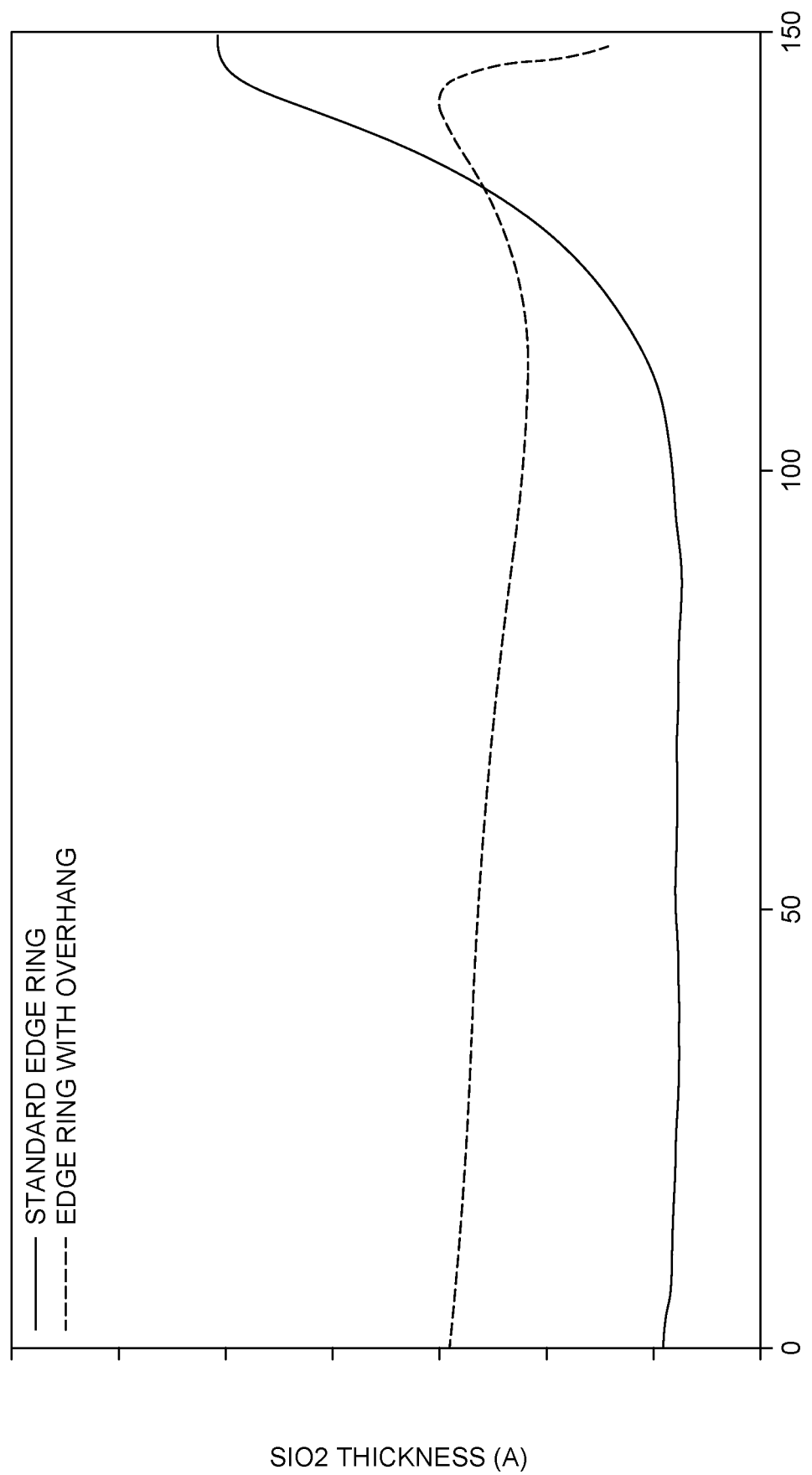
FIG. 6 is a graph illustrating the film thickness over a substrate using two different edge rings.

FIG. 6 is a graph illustrating the film thickness over a substrate after using two different edge rings during an $SiO_2$ treatment, such as an $SiO_2$ oxidation process. A first edge ring is a standard edge ring and has poor thickness uniformity near the edge of a substrate (represented by the solid line). The second edge ring is an edge ring utilizing an overhang feature, such as the edge ring 140b described herein and has improved thickness uniformity near the edge of the substrate.

FIG. 6 shows greatly improved layer thickness near the edge of the substrate. The improved layer thickness is caused at least in part by the altering of the direct RF current communication paths, such as the RF currently lines 124 in FIG. 1, between the substrate and the sidewalls of the process chamber. In conventional substrate treatment processes with high bias-to source power ratios, plasma density and the plasma current to the substrate is affected. The affected plasma current and density result in film thickening toward the substrate edge. The film thickening toward the substrate edge is caused by direct RF communication between the substrate and the grounded sidewall, rather than through the plasma controlled by the source power coil.

As shown in FIG. 6, utilizing edge rings with overhang rings has been found to produce higher uniformity and alter the direct RF communication path to pass through the higher density plasma formed by the source power coil. The RF current lines 124 are altered to flow through a plasma, such as the first plasma region and the second plasma region.

The overhang ring changes the paths of the RF current lines 124 to pass through a region with higher plasma density than would be achieved if using a conventional edge ring. The second portion 210 of the overhang ring 112 pushes the RF current lines 124 inward so that the RF current lines 124 pass through a region of higher plasma density and does not significantly alter the ion current to the substrate near the edge since the first portion 210 of the overhang ring 112 is not disposed immediately adjacent to the edge of the substrate.

Although both the edge rings 140a, 140b and the overhang ring 112 are described herein as being a quartz material, it is contemplated that other materials could also be used within the edge ring 140 and/or the overhang ring 112. Other materials which could be a part of the edge ring 140a, 140b and the overhang rings 112 include silicon carbide, alumina, or yttria. In some embodiments, other ceramic materials are utilized. In some embodiments, the quartz material can include additional materials embedded therein.

While some corners of the edge rings 140a, 140b and the overhang ring 112 are described above as being curved corners, it is contemplated that all of the corners of the edge rings 140a, 140b and the overhang ring 112 may be curved corners. Unless otherwise described above, all of the corners of the edge rings 140a, 140b and the overhang ring 112 may be broken to be curved edges with a radius of curvature of less than about 1 mm, such as less than about 0.75 mm, such as less than about 0.5 mm. In an alternative embodiment, all of the corners of the edge rings 140a, 140b and the overhang ring 112 may be sharp corners.

In some embodiments, the edge ring 140a of FIG. 2A is utilized. In this embodiment, an apparatus for substrate processing includes an edge ring. The edge ring includes a bottom surface and an upper surface. The upper surface further includes a cantilever, a extended main body, and an outer body. The cantilever is disposed radially inward of the extended main body and the extended main body is disposed radially inward of the outer body. The extended main body includes an inner surface, an outer surface, and an upper surface. The upper surface includes a vertical protrusion disposed thereon and the extended main body has a height of about 10 mm to about 40 mm.

While embodiments herein generally describe dimensions with respect to processing 300 mm substrates, it is contemplated that substrates of other dimensions may also be processed. In such examples, the dimensions of the edge rings described herein may be scaled accordingly.

While the foregoing is directed to embodiments of the present disclosure, other and further embodiments of the disclosure may be devised without departing from the basic scope thereof, and the scope thereof is determined by the claims that follow.

What is claimed is:

1. An edge ring for substrate processing comprising:
    a ring shaped body comprising:
        a bottom surface;
        an upper surface;
        an inner surface connecting the bottom surface and the upper surface and forming an opening centered around a central axis;
        a plurality of protrusions extending from the upper surface and spaced around the opening;
        a cantilever portion extending from the inner surface and configured to support a substrate thereon; and
        an annular groove formed in the upper surface and extending towards the bottom surface and radially outward from the plurality of protrusions, the annular groove configured to receive a portion of an overhang ring,
        wherein the bottom surface further comprises:
            an inner bottom surface disposed below the plurality of protrusions;
            a primary bottom surface disposed below the annular groove; and
            a lower stepped surface connecting the inner bottom surface and the primary bottom surface.

2. The edge ring of claim 1, wherein the annular groove of the edge ring has an inner sidewall and an outer sidewall which are parallel and concentric, both of the inner sidewall and the outer sidewall centered around the central axis.

3. The edge ring of claim 2, wherein the inner sidewall and the outer sidewall are less than about 20 mm apart.

4. The edge ring of claim 3, wherein the inner sidewall of the annular groove has a diameter of about 325 mm to about 350 mm.

5. The edge ring of claim 1, wherein the edge ring comprises a quartz material.

6. The edge ring of claim 1, wherein the plurality of protrusions comprises 3 to 10 protrusions.

7. The edge ring of claim 6, wherein a protrusion inner surface has a diameter of about 300 mm to about 315 mm.

8. The edge ring of claim 7, wherein the protrusion inner surface of each of the plurality of protrusions has a width of about 5 mm to about 25 mm.

9. The edge ring of claim 1, wherein the edge ring further comprises an outer ledge, the outer ledge extending from the bottom surface of the edge ring.

10. The edge ring of claim 1, wherein the inner surface has an inner diameter of about 295 mm to about 300 mm.

11. The edge ring of claim 1, wherein the inner bottom surface and the lower stepped surface form a stepped region and the stepped region corresponds to and engages with a stepped portion of a pedestal assembly.

12. An edge ring, configured for use during semiconductor manufacturing, comprising:
    a ring shaped body comprising:
        a bottom surface;
        an upper surface positioned at an angle relative to the bottom surface;
        an inner surface connecting the bottom surface and the upper surface and forming an opening with a diameter of about 295 mm to about 300 mm centered around a central axis;
        a protrusion formed in the upper surface;
        a cantilever portion extending from the inner surface and configured to support a substrate thereon; and
        a groove extending inward from the upper surface towards the bottom surface and radially outward from the protrusion, the groove configured to receive a portion of an overhang ring, wherein the bottom surface further comprises:
            an inner bottom surface disposed below the protrusion;
            a primary bottom surface disposed below the groove; and
            a lower stepped surface connecting an outer edge of the inner bottom surface and the primary bottom surface.

13. The edge ring of claim 12, wherein the bottom surface further comprises:
    an inner ledge surface connected to an outer edge of the primary bottom surface.

14. The edge ring of claim 13, wherein a bottom surface of the groove is about 1 mm to about 5 mm vertically disposed from the inner bottom surface.

15. The edge ring of claim 12, wherein the groove is a discontinuous groove.

16. The edge ring of claim 12, wherein the protrusion is one of a plurality of protrusions.

17. The edge ring of claim 12, wherein the groove is less than about 15 mm in width.

18. An edge ring, configured for use during semiconductor manufacturing, comprising:
    a ring shaped body comprising:
        a bottom surface comprising:
            an inner bottom surface;
            a lower stepped surface connected to an outer edge of the inner bottom surface;
            a primary bottom surface connected to an opposite end of the lower stepped surface as the inner bottom surface;

an inner ledge surface connected to an outer edge of the primary bottom surface; and a ledge bottom surface connected to the inner ledge surface;

an upper surface comprising:

an inner surface connecting the bottom surface and the upper surface and forming an opening with an inner surface diameter of about 295 mm to about 300 mm centered around a central axis of the edge ring;

a top cantilever surface extending from the inner surface and configured to support a substrate thereon;

a plurality of protrusions extending from the upper surface and spaced evenly about the central axis of the edge ring, the protrusion having a protrusion inner surface which intersects the top cantilever surface and has a protrusion diameter of about 300 mm to about 315 mm;

an intermediate surface extending at an angle relative to the top cantilever surface and radially outward of the top cantilever surface and the plurality of protrusions;

an inner main surface coplanar with the intermediate surface and radially outward of the intermediate surface;

a groove disposed between the intermediate surface and the inner main surface and extending towards the bottom surface, the groove further comprising an inner groove sidewall which intersects the intermediate surface and an outer groove sidewall which intersects the inner main surface, wherein the inner groove sidewall and the outer groove sidewall are spaced less than about 25 mm apart, the groove configured to receive a portion of an overhang ring; and an outer ledge surface extending perpendicular to the top cantilever surface and coupled to the ledge bottom surface; and wherein the inner bottom surface is disposed below the plurality of protrusions and the primary bottom surface is disposed below the groove.

19. The edge ring of claim 18, wherein an outer curved portion connects the inner main surface and the outer ledge surface and the inner groove sidewall and the outer groove sidewall are parallel.

20. The edge ring of claim 18, wherein the protrusion inner surface further comprises:

a first inner protrusion surface extending from and perpendicular to the top cantilever surface; and a second inner protrusion surface extending from the first inner protrusion surface and at an angle of about 5 degrees to about 20 degrees outward relative to a vertical formed by the first inner protrusion surface.

* * * * *